(12) United States Patent  
Chen et al.

(10) Patent No.: US 7,829,815 B2
(45) Date of Patent: Nov. 9, 2010

(54) ADJUSTABLE ELECTRODES AND COILS FOR PLASMA DENSITY DISTRIBUTION CONTROL

(75) Inventors: Ying-Lin Chen, Tainan County (TW); Chi-An Kao, Tainan (TW); Po-Zen Chen, Kaohsiung (TW); Yi-Li Hsiao, Hsinchu (TW); Chen-Hua Yu, Hsinchu (TW); Jean Wang, Hsinchu (TW); Lawrance Sheu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 137 days.

(21) Appl. No.: 11/534,495

(22) Filed: Sep. 22, 2006

(65) Prior Publication Data

US 2008/0083710 A1  Apr. 10, 2008

(51) Int. Cl.
 *B23K 10/00* (2006.01)

(52) U.S. Cl. ............... 219/121.48; 219/121.43; 219/121.52; 156/345.47; 156/345.34; 118/723 I

(58) Field of Classification Search .......... 219/121.4, 219/121.41, 121.43, 121.44, 121.59, 121.52; 156/345.47, 345.34; 118/723 R, 723 I
 See application file for complete search history.

(56) References Cited

U.S. PATENT DOCUMENTS

| | | | |
|---|---|---|---|
| 5,304,250 A | 4/1994 | Sameshima et al. | |
| 5,683,548 A | 11/1997 | Hartig et al. | |
| 6,229,264 B1* | 5/2001 | Ni et al. ............. | 315/111.51 |
| 6,432,730 B2 | 8/2002 | Okumura et al. | |
| 6,855,225 B1 | 2/2005 | Su et al. | |
| 6,913,703 B2 | 7/2005 | Strang et al. | |
| 6,916,401 B2* | 7/2005 | Long .................. | 156/345.43 |
| 2002/0170676 A1* | 11/2002 | Mitrovic et al. ...... | 156/345.47 |
| 2003/0103877 A1 | 6/2003 | Long | |
| 2007/0256787 A1* | 11/2007 | Chandrachood et al. .............. | 156/345.48 |

FOREIGN PATENT DOCUMENTS

| | | | |
|---|---|---|---|
| JP | 2000208483 A | 7/2000 | |
| JP | 2002359232 A | 12/2002 | |

OTHER PUBLICATIONS

Taiwanese Office Action dated Apr. 28, 2010.
Chinese Office Action dated Jun. 1, 2010.
TW Office Action issued Jul. 30, 2010.

* cited by examiner

*Primary Examiner*—Mark H Paschall
(74) *Attorney, Agent, or Firm*—Duane Morris LLP

(57) ABSTRACT

A adjustable upper coil or electrode for a reaction chamber apparatus useable in semiconductor processing, is constructed so that its shape may be selectively changed or so at least two portions thereof may be selectively driven at different power and/or frequencies. The adjustable upper coil or electrode, therefore, enables the plasma density distribution in the reaction chamber apparatus to be selectively controlled.

38 Claims, 23 Drawing Sheets

ADJUSTABLE ELECTRODES AND COILS FOR PLASMA DENSITY DISTRIBUTION CONTROL

FIELD OF THE INVENTION

The invention relates to semiconductor fabrication. In particular, the present invention relates to adjustable electrodes and coils for controlling the plasma density distribution in a dry processing apparatus.

BACKGROUND OF THE INVENTION

Uniformity control across a semiconductor wafer is becoming more important, especially through nanometer technology. It is becoming more difficult to satisfy advanced semiconductor process requirements in terms of uniformity of etch rate, etch profile, CDU, etch selectivity, residue, deposition rate and so on, using current semiconductor process tools, equipment and methods. Current tools, equipment and methods are generally incapable of achieving the requirements for 45 nanometer (nm) and smaller process technology, and/or 300 mm (~12-inches in diameter) and larger wafers.

For example, dry process reactor systems are used in semiconductor fabrication for performing various semiconductor processes, such as etching, chemical vapor deposition (CVD), or diffusion. Some dry process reactor systems use a parallel-plate plasma reactor, which typically includes fixed, upper and lower plates or electrodes with a fixed, three-dimensional space therebetween. The upper electrode may be driven by an RF generator to generate and control an ion plasma in the fixed, three-dimensional space between the upper and lower electrodes. Other dry process reactor systems use an inductively coupled plasma (ICP) reactor. An ICP reactor typically includes a fixed, upper coil, a fixed lower plate or electrode, and a fixed, three-dimensional space therebetween. The upper coil may also be driven by an RF generator to generate and control an ion plasma in the fixed, three-dimensional space between the upper coil and lower electrode.

A limitation shared by both the upper coil and the upper electrode is that their physical configuration cannot be adjusted to control the density distribution of the ion plasma. This limitation causes non-uniform device characteristics across the wafer, as semiconductor wafers increase in size and minimum device feature size decreases.

Accordingly, improved upper coils and electrodes are needed which allow the density distribution of the ion plasma to be controlled.

SUMMARY

An adjustable electrical conductor comprising an adjustable coil or an adjustable electrode that in use in a reaction chamber is capable of generating a plasma having a density that can be selectively varied across a space within the reaction chamber.

An apparatus comprising a reaction chamber, a holder disposed within the reaction chamber, the holder for holding a semiconductor wafer or substrate, and an adjustable electrical conductor comprising an adjustable coil or an adjustable electrode, disposed in the chamber and spaced from the holder, the adjustable electrical conductor for generating a plasma having a density that can be selectively varied across a space within the reaction chamber.

A method comprising the steps of placing a wafer or substrate into a reaction chamber including an adjustable electrical conductor comprising an adjustable coil or an adjustable electrode, and adjusting the adjustable electrical conductor to generate a plasma having a density that can be selectively varied across a space within the reaction chamber.

DETAILED DESCRIPTION

Disclosed herein is an adjustable upper electrode or coil for an apparatus of the type which may be used in the dry processing of semiconductor wafers and other wafers and substrates. The adjustable electrode or coil may be used in any dry processing or like apparatus that uses an upper electrode or coil including, for example but not limited to, parallel-plate plasma reactors.

Figure 1:
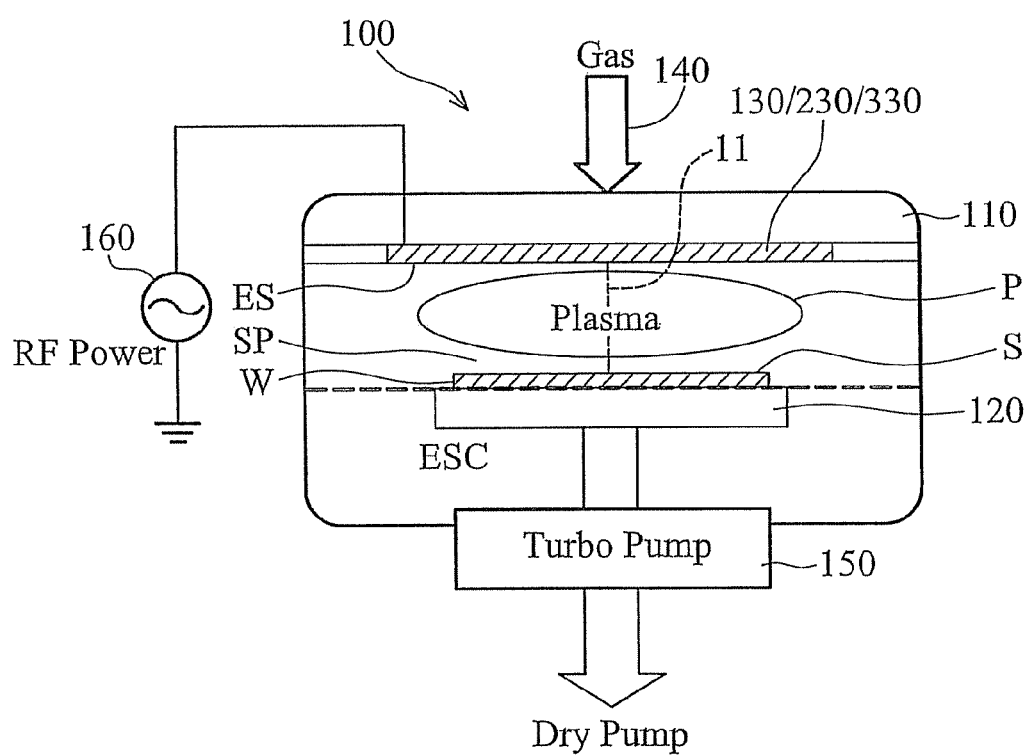
FIG. 1 is a cross-sectional schematic of an embodiment of a parallel-plate plasma reactor for a dry process reactor system, having an adjustable upper electrode for ion plasma density distribution control.

FIG. 1 is a cross-sectional schematic of an embodiment of a parallel-plate plasma reactor 100 for a dry process reactor system, having an adjustable upper electrode for ion plasma density distribution control capability. The plasma reactor 100 may be used in semiconductor fabrication for performing various semiconductor processes, such as dry etching, chemical vapor deposition (CVD), or diffusion. The plasma reactor 100 may comprise a pressure reaction chamber 110 capable of being heated to a temperature ranging, for example, between about 20° C. to about 300° C., and a wafer holder 120 having in any suitable shape, such as circular, elliptical, square, and the like, disposed within the reaction chamber for mounting a wafer W having a process surface S (typically about 4 to about 12 inches in diameter or larger). In some embodiments, the wafer holder 120 may comprise an electrostatic chuck (ESC). In addition, the wafer holder 120/ wafer W may also operate as a fixed lower electrode. An adjustable upper electrode, denoted generally by numeral 130, is disposed within the reaction chamber 110 above the wafer W/wafer holder 120. Plasma source (reactant) gases may be introduced into the reaction chamber 110 via one or more source gas inlets 140 and spent process gases and etchant by-products may be exhausted from the reaction chamber 110 via a pump 150. In some embodiments, the source gases may be introduced into the reaction chamber 110 at a flow rate of about 5 to about 50,000 sccm (standard cubic centimeters per minute), and preferably at a flow rate of about 10 to about 5,000 sccm. The lower electrode 120 may be connected to ground (not shown) and the adjustable upper electrode 130 may be driven by an RF generator 160 to generate and control an ion plasma P in a three-dimensional space (e.g., between less than 3 mm to about 600 mm formed between the lower surface ES of the adjustable upper electrode 130 and the process surface S of the wafer W. In some embodiments, the RF power generated by the RF generator 160 may range between about 10 watts to about 40 kilowatts and have a frequency of about 50 KHz to about 100 MHz.

The shape of the adjustable upper electrode 130 may be adjusted at any time (before or during processing) in accordance with a desired semiconductor process recipe to provide an ion plasma density distribution which suits a given process requirement, e.g., 45 nm and smaller process technology and/or 12-inch and larger wafers. The ability to provide a desired ion plasma density distribution allows for a wider process window and/or more process control.

More specifically, adjusting the shape of the adjustable upper electrode from a planar shape to a non-planar shape, e.g., concave, convex, undulating, etc., allows selective tuning of the ion plasma density distribution within the three-dimensional space SP, which in turn allows the process specification or specifications e.g., etch rate, etch profile, critical dimension uniformity (CDU), etch selectivity, residue and deposition rate, to be selectively varied across the process surface S of the wafer W. This is because the non-planar shape of the adjustable upper electrode provides the three-dimensional space SP (between the bottom surface ES of the adjustable upper electrode 130 and the process surface S of the wafer W) with a height H that may be varied (in dimension) across the process surface of the wafer W. The variable height H of the three-dimensional space SP, in turn, provides a correspondingly varied ion plasma density distribution, which alters the process specification or specifications across the process surface S of the wafer W. Hence, the uniformity of the process specification or specifications may be controlled, as desired, across the process surface S of the wafer W.

Figure 2A:
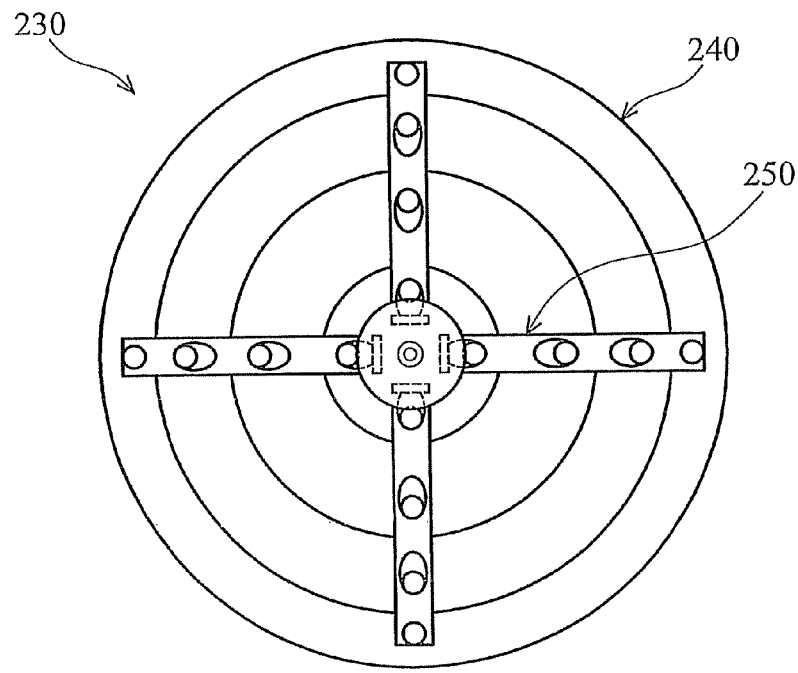
FIG. 2A is a top plan view of an embodiment of the adjustable upper electrode.
Figure 2B:
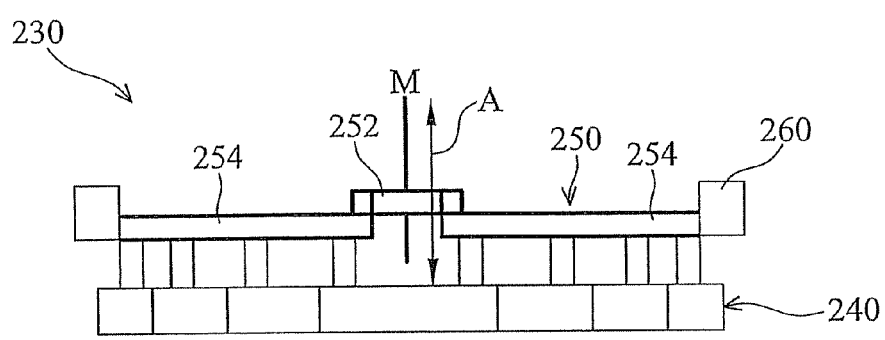
FIG. 2B is an elevational view of the adjustable upper electrode of FIG. 2A.

FIGS. 2A and 2B are bottom plan and elevational views of an embodiment of the adjustable upper electrode, denoted by numeral 230. The adjustable upper electrode 230 comprises an electrode 240 formed by a plurality of concentric plates and a linearly movable slide holder assembly 250 for moving or positioning the concentric electrode plates in the same or into various different planes, to provide the three-dimensional space SP with a variable height across the process surface S of the wafer W. In other embodiments, the electrode may be square, rectangular, oval, etc., and/or divided into a plurality of adjustable plates which may or may not be concentric, but which move individually with respect to one another into different location settings.

Figure 3:
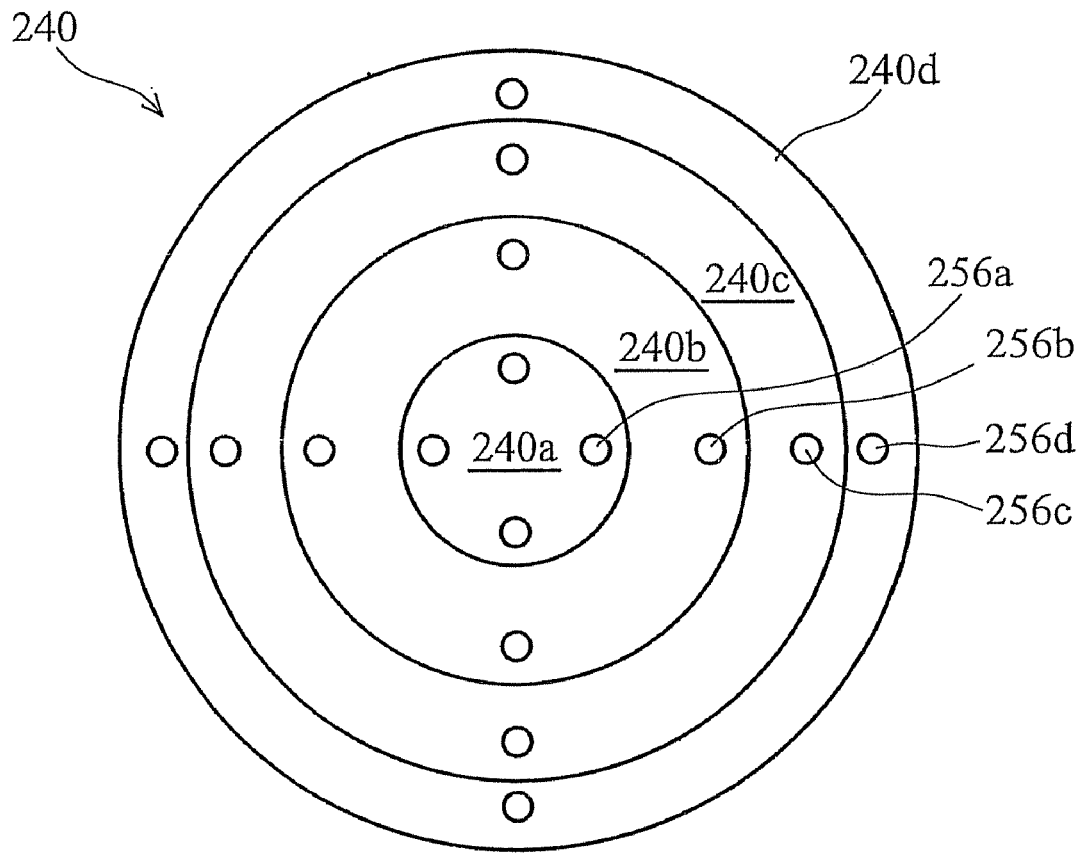
FIG. 3 is a top plan view of the electrode of the adjustable upper electrode shown in FIGS. 2A and 2B.

As shown in the top plan view of FIG. 3, the plurality of concentric electrode plates may be formed by a disc-shape central plate 240a, two circular ring-shape intermediate plates 240b, 240c and a circular ring-shape outer plate 240d. In other embodiments, the central plate, the ring-shape intermediate plates and/or the ring-shape outer plate may be other shapes including, but not limited to square, rectangular, and oval. The plurality of concentric electrode plates, in other embodiments, may comprise any plural number of plates, depending upon the implementation. In some embodiments, at least one of the central plate, the ring-shape intermediate plates and/or the ring-shape outer plate, may comprise one or more one openings for allowing process gases to pass therethrough, the size of which may be adjustable. The size of the opening(s) is preferably less than about 3 mm in diameter. In yet other embodiments, the plates may be driven at different powers and/or frequencies by a corresponding plurality of RF or microwave generators.

Figure 4:
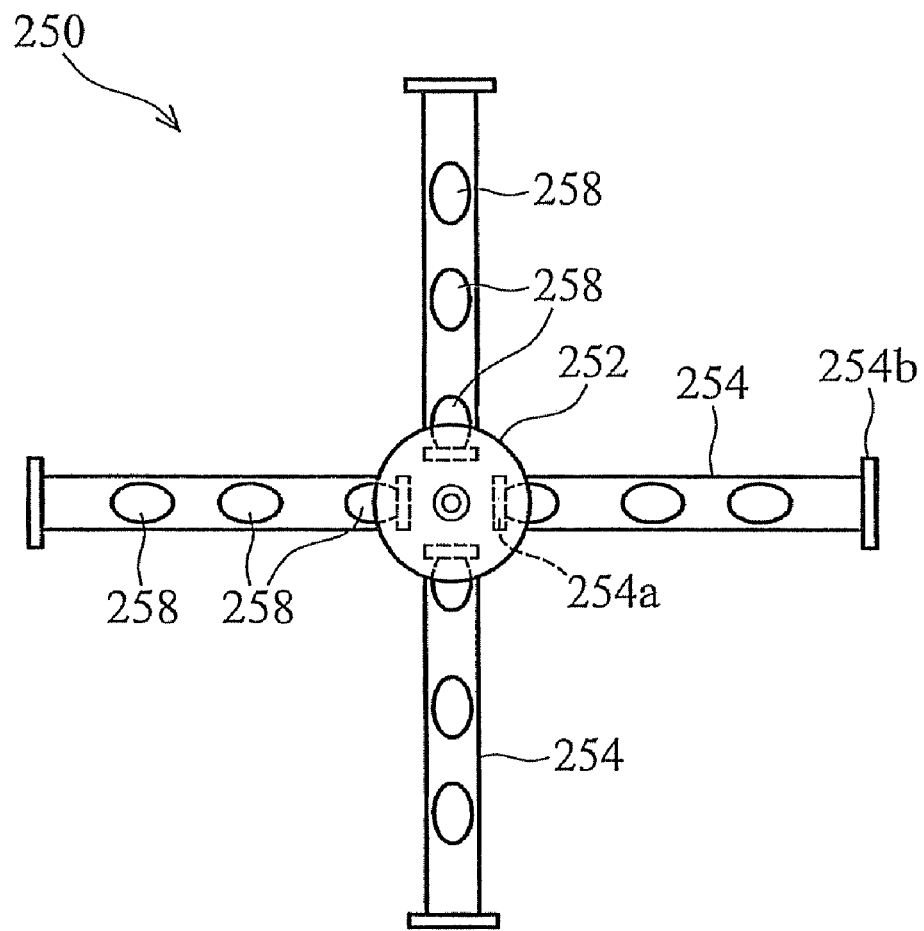
FIG. 4 is a plan view of a linearly moveable slide holder assembly of the adjustable upper electrode shown in FIGS. 2A and 2B.

As shown in the top plan view of FIG. 4, the linearly movable slide holder assembly 250, may comprise a vertically movable central hub member 252, two or more arm members 254 radially extending from the central hub member 252, and a plurality of rod-shape connecting elements 256a-d (see for example FIGS. 3 and 5A) connecting the arm members 254 to concentric electrode plates 240a, 240b, 240c, 240d. The arm members 254 have inner ends 254a, which are pivotally connected to the central hub member and outer ends 254b which are configured to be pivotally connected to a fixed upper electrode support structure 260 (FIG. 2B) inside the reaction chamber.

Figure 5A:
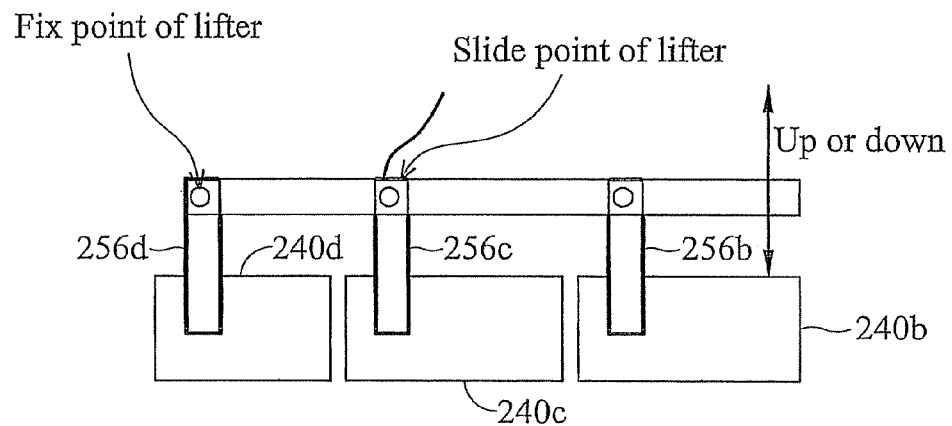
FIG. 5A is a partial elevational view of the adjustable upper electrode shown in FIGS. 2A and 2B.

As shown in the cross-sectional view of FIG. 5A, upper portions of the connecting elements 256a-c extend through elongated openings 258 (FIG. 4) in the arm members 254. The connecting elements 256a-c have lower ends which may be connected to the concentric electrode plates 240a, 240b, 240c in a fixed manner and upper ends that may be slidably connected within the elongated openings 258 of the arm members 254. The upper and lower connecting elements 256d may be connected to the arm members 254 and the outer electrode plate 240d in a fixed manner. The connecting elements 256a-c slide outwardly or inwardly within the elongated openings 258 of the arm members 254 as the arm members 254 pivot down or up, respectively, thereby allowing the electrode plates 240a, 240b, 240c to stay parallel with the process surface S of the wafer W as the shape of the electrode 240 is adjusted. In the embodiment shown in FIGS. 2A, 2B, 3, 4, 5A, and 6A-6B, each of the electrodes plates 240a, 240b, 240c, 240d is connected to one of the arm members 254 by at least one connecting element 256. In other embodiments, one or more of the electrode plates may be fixed and thus, only the vertically moveable electrode plates would be connected to the arm members by the connecting elements.

Referring again to FIG. 2B, the axially moveable central hub 252 of the linearly moveable slide holder assembly, may be vertically moved (e.g., up and down) along its central axis A by an actuator M, such as a stepper motor controlled linear actuator. In other embodiments, an air or hydraulic cylinder or a series of slide track points may be used for vertically moving or positioning the electrode plates in the same or into various different planes.

Figure 5B:
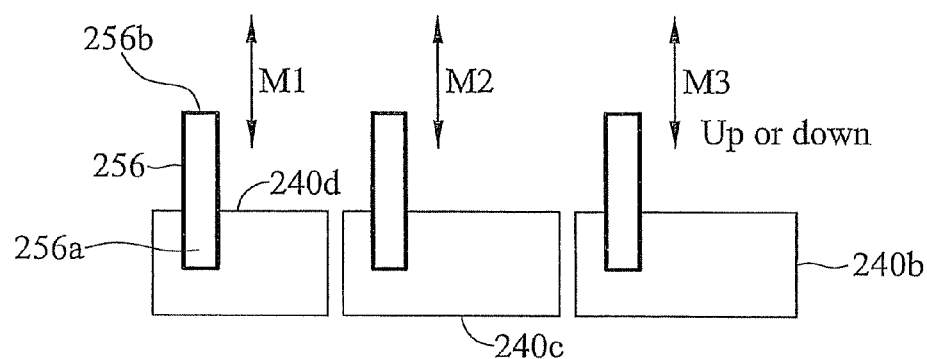
FIG. 5B is a partial elevational view showing a variation of the adjustable upper electrode shown in FIGS. 2A and 2B.
Figure 6A:
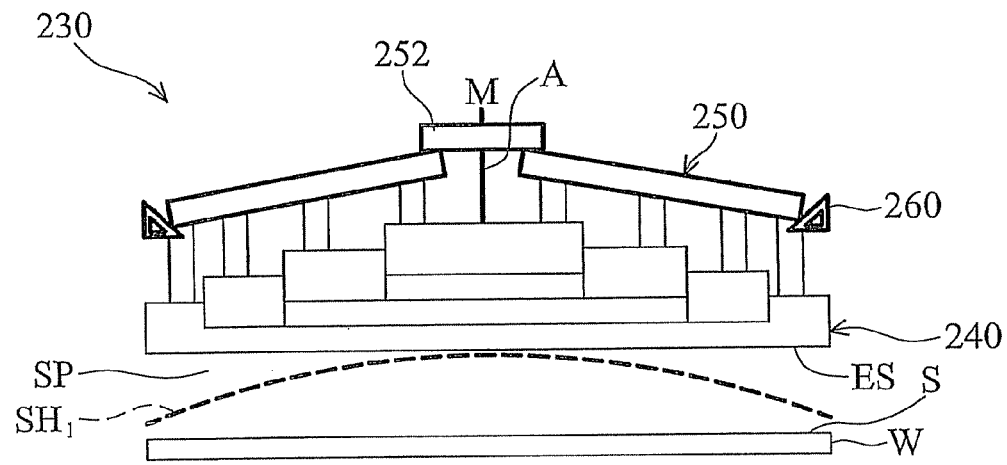
FIGS. 6A-6C are elevational views illustrating the operation of the adjustable upper electrode shown in FIGS. 2A and 2B.
Figure 6B:
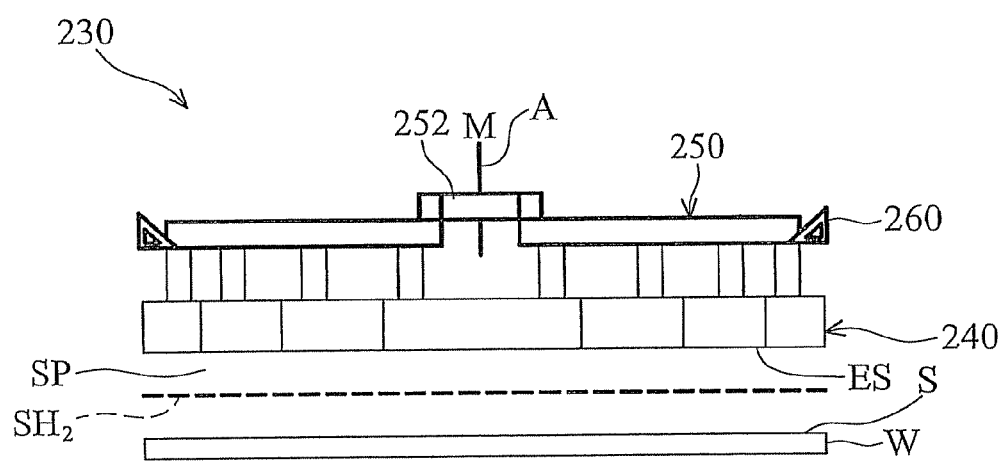
Figure 6C:
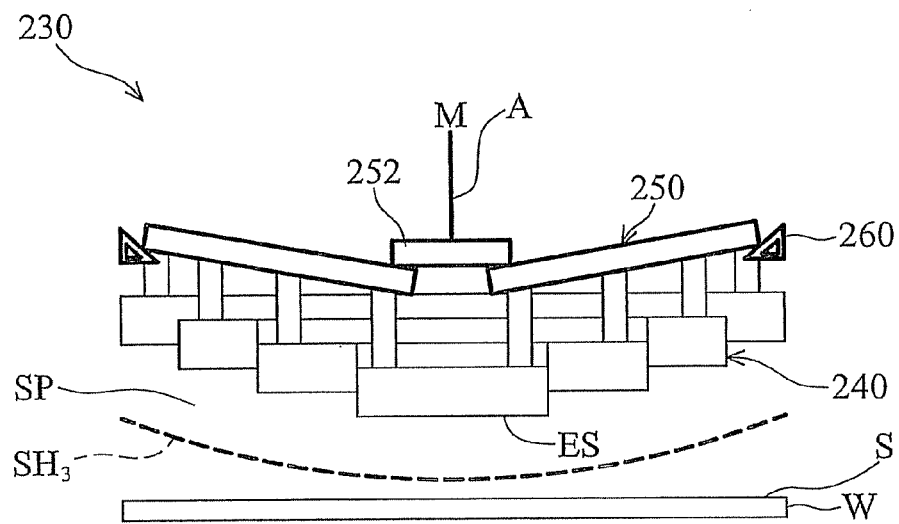
Figure 6D:
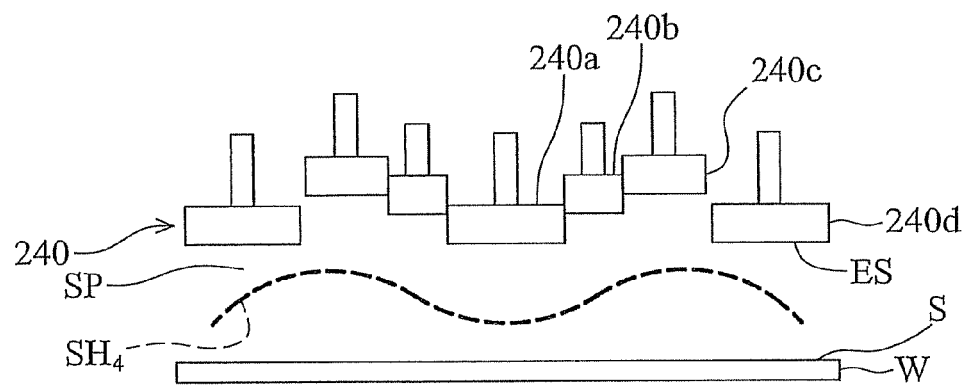
FIG. 6D is an elevational view illustrating the operation of the adjustable upper electrode shown in FIG. 5B.

FIGS. 5B and 6D are partial and complete elevational views, respectively, of a variation of the adjustable upper electrode shown in FIGS. 2A and 2B. In this embodiment, the central hub and arm members of the slide holder assembly are replaced by a plurality of actuators M1, M2, which operate directly on the connecting elements 256 to vertically move electrode plates 240b and 240c up and down into different planes. The outer electrode plate 240d is fixed in the embodiment, however, in other embodiments, the outer electrode plate may be vertically moveable via an actuator.

Although not shown, in further embodiments, the intermediate portions of the arm members may be pivotally connected to a fixed electrode support structure inside the reaction chamber so that the outer ends of the arm members are free to move up and down when the central hub is vertically moved by the actuator. In still other embodiments, (not shown) the central hub may be connected to a fixed electrode support structure inside the reaction chamber and the outer ends of the arm members are actuated to move (e.g., up and down) to change the shape of the electrode.

Figure 7A:
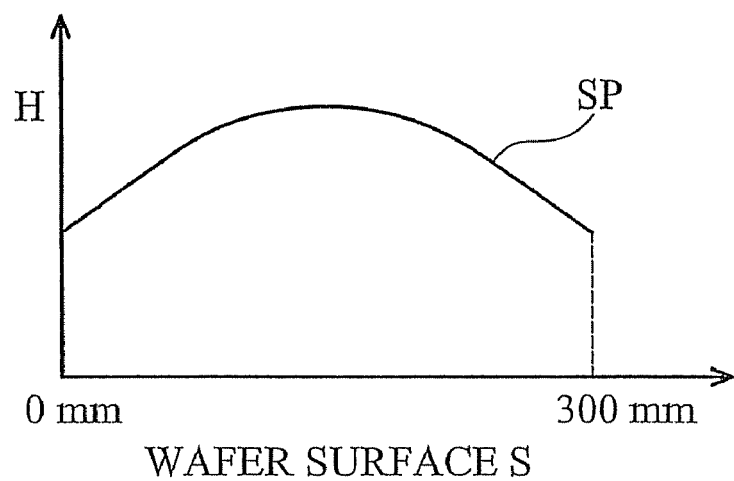
FIGS. 7A-7D illustrate how the height of the three-dimensional space across the process surface of the wafer when the upper electrode is adjusted into the shapes shown in FIGS. 6A-6D, respectively.
Figure 7B:
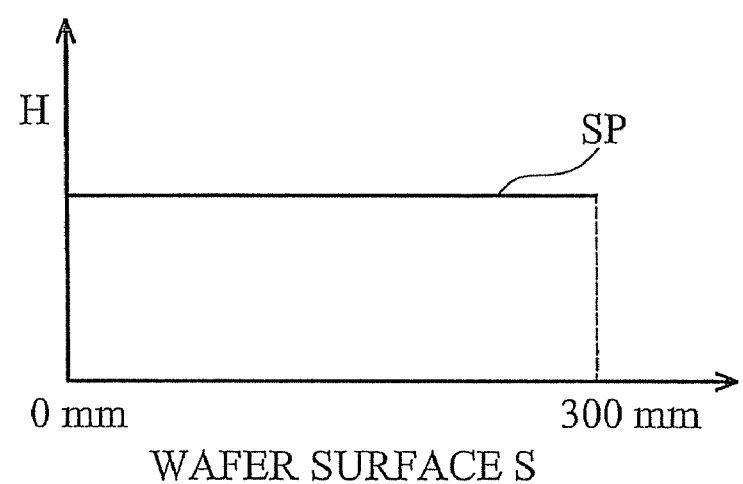
Figure 7C:
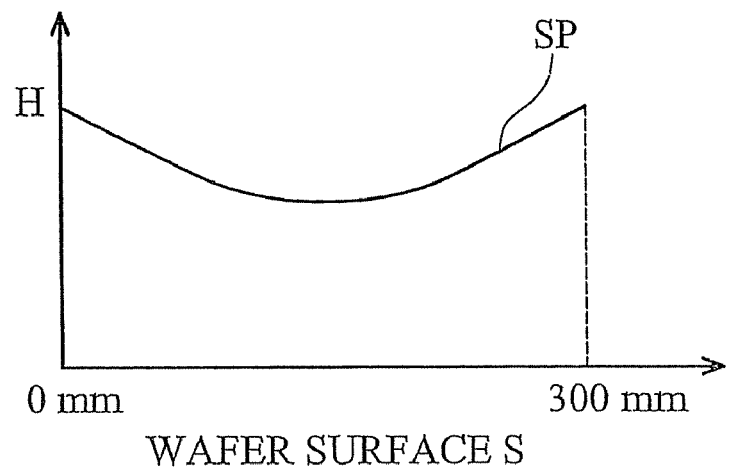

Referring to the elevational views of FIGS. 6A-6C, the linearly movable slide holder assembly 250 is operated to adjust the shape of the electrode 240, by operating the actuator M which moves the central hub 252 up or down. The up or down movement of the central hub 252 raises or lowers the electrode plates 240a, 240b, 240c, 240d into various different planes, thus varying the shape of the electrode 240. As shown in FIGS. 7A-7C, the height H of the three-dimensional space SP varies across the surface process S of the wafer W (e.g. a wafer having a 300 mm diameter), to provide a desired ion plasma density distribution within space SP which suits a given process requirement. The shape of the electrode may be adjusted at any time (before or during processing) in accordance with a desired semiconductor process recipe. FIG. 7A illustrates how the height H of the three-dimensional space SP varies in dimension across the process surface S of the wafer W when the electrode 240, as shown in FIG. 6A, is adjusted into a shape $SH_1$ which is convex up. FIG. 7B illustrates how the height H of the three-dimensional space SP remains a constant dimension across the process surface S of the wafer W when the electrode 240, as shown in FIG. 6B, is adjusted into a shape $SH_2$ which is generally planar. FIG. 7C illustrates how the height H of the three-dimensional space SP varies in dimension across the process surface S of the wafer W when the electrode 240, as shown in FIG. 6C, is adjusted into a shape $SH_3$ which is concave down.

Figure 7D:
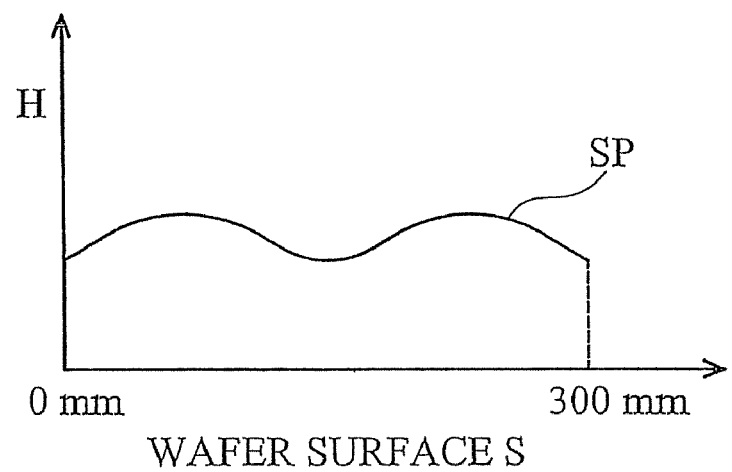

One or both of the actuators M1, M2 of the adjustable electrode shown in FIGS. 5B and 6D, are operated to raise or lower the electrode plates 240b, 240c into various different planes, thus varying the shape of the electrode 240. As in the previous embodiment, varying the shape of the electrode 240 allows the height H of the three-dimensional space SP to be varied across the process surface S of the wafer W. FIG. 7D illustrates how the height H of the three-dimensional space SP varies in dimension across the surface S of the wafer W when the electrode 240, as shown in FIG. 6D, is adjusted into a shape $SH_4$ which is undulating.

Figure 8A:
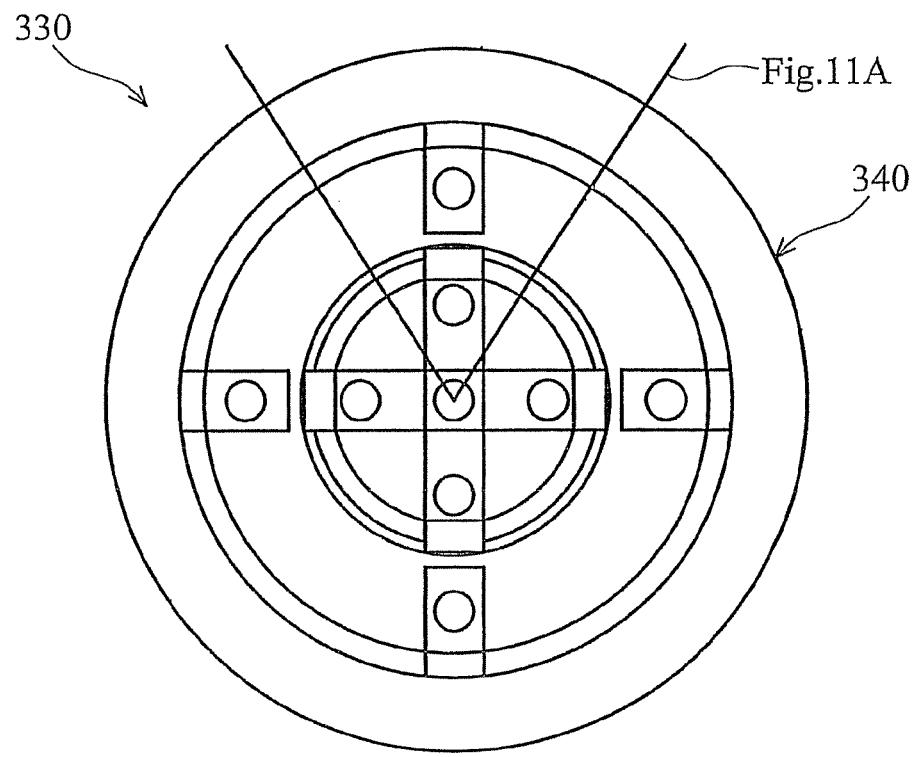
FIG. 8A is a top plan view of another embodiment of the adjustable upper electrode.
Figure 8B:
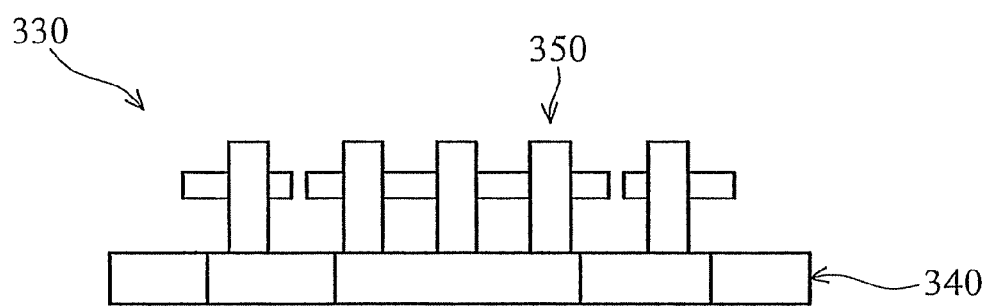
FIG. 8B is an elevational view of the adjustable upper electrode of FIG. 8A.

The top plan view of FIG. 8A and the side elevational view of FIG. 8B collectively show another embodiment of the adjustable upper electrode, denoted by numeral 330. The adjustable upper electrode 330 comprises an electrode 340 formed by a plurality of concentric plates similar to the previous embodiment, and a rotatable slide holder assembly 350 for varying the shape of the electrode.

Figure 9:
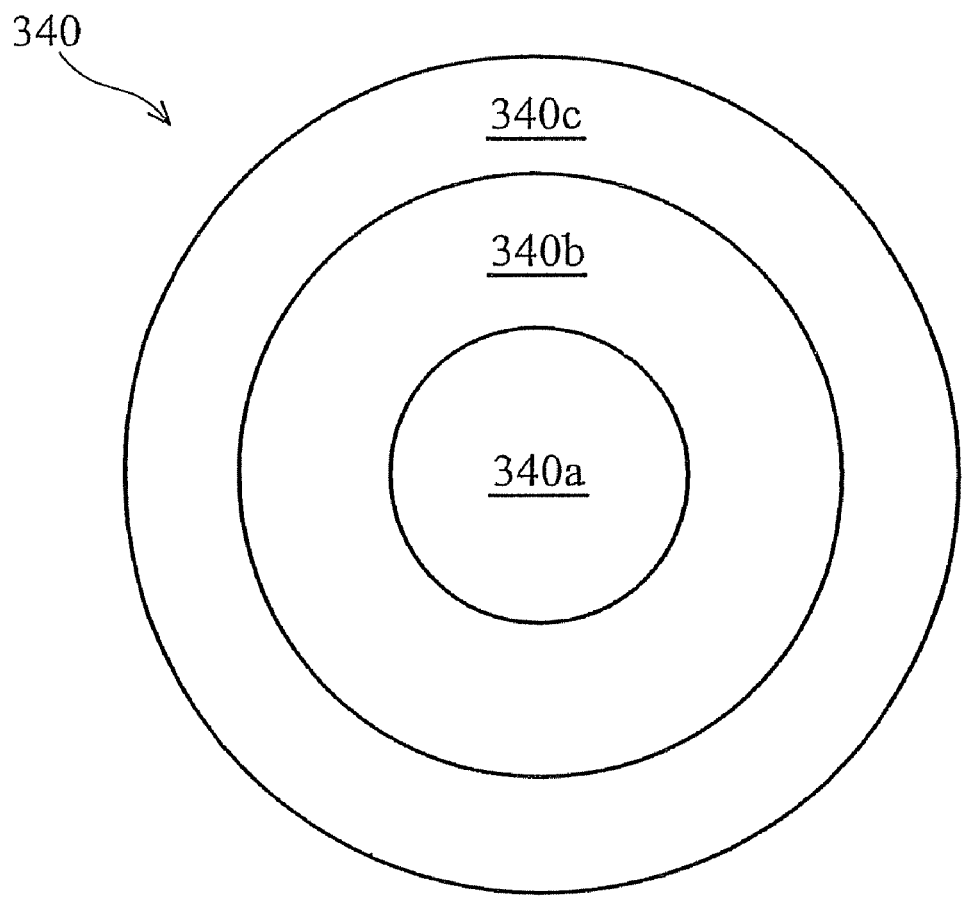
FIG. 9 is a top plan view of an electrode of the adjustable upper electrode shown in FIGS. 8A and 8B.

As shown in the top plan view of FIG. 9, the plurality of concentric plates may comprise a disc-shape central plate 340a, a circular ring-shape intermediate plate 340b and a circular ring-shape outer plate 340c. In some embodiments, the plates may be driven at different powers and/or frequencies by a corresponding plurality of RF or microwave generators.

Figure 10:
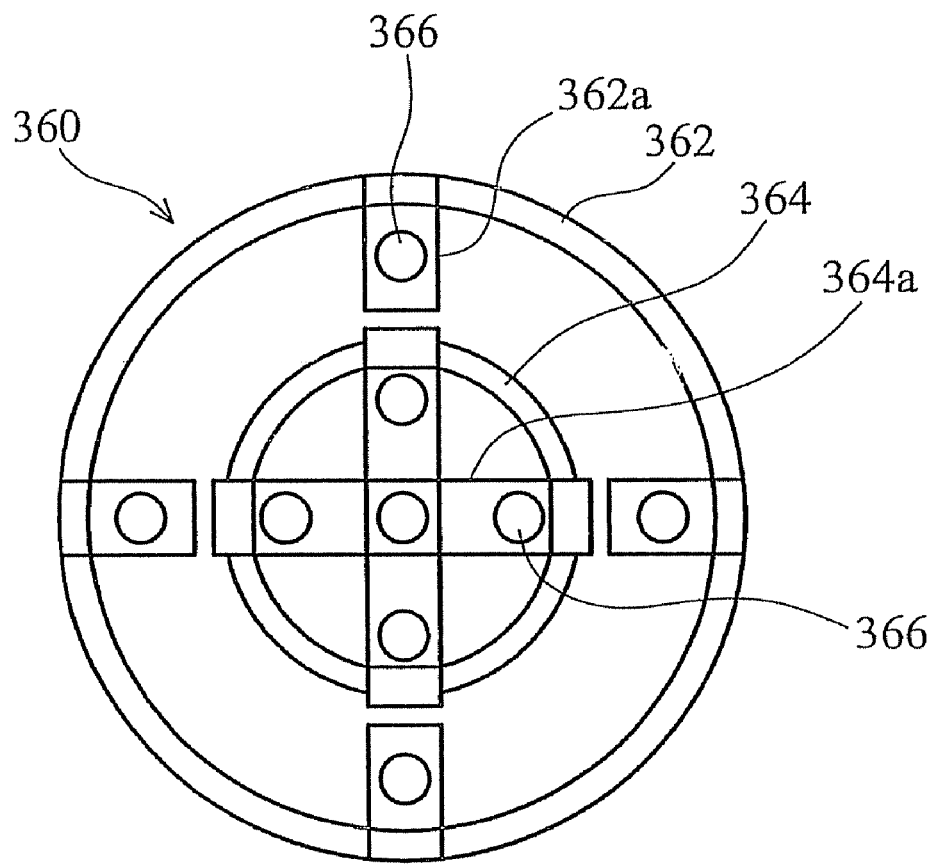
FIG. 10 is a plan view of a rotatable slide holder assembly of the adjustable upper electrode shown in FIGS. 8A and 8B.

The rotatable slide holder assembly 350 may comprise a plate rotating apparatus 360, as shown in FIG. 10, for selectively rotating one or more of the electrode plates 340a, 340b, 340c, and a cam groove and follower arrangement as shown in FIGS. 11A-11D for causing the electrode plates 340a, 340b, 340c to move vertically up or down when rotated relative to one another by the rotating apparatus 360, thereby positioning them in the same or different planes to change the shape of the electrode 340.

Referring to FIG. 10, the rotating apparatus 360 may comprise an outer rim member 362 for rotating the intermediate plate 340b and an inner rim member 364 for rotating the central plate 340a. The outer rim member 362 may have at least one flange 362a for slidably receiving an end of a rod-shape connecting element 366 fixedly connected to the intermediate electrode plate 340b. The inner rim member 364 may have at least one cross arm 364a for slidably receiving an end of another rod-shape connecting element 366 fixedly connected to the central electrode plate 340a. The outer and inner rim members 362 and 364 may be selectively rotated by corresponding stepper motors (not shown). It should be understood, however, that other methods may be used for rotating the outer and inner rim members 362 and 364.

The cam groove and follower arrangement connects the electrode plates 340a, 340b, 340c to one another so that relative rotation between adjacent electrode plates causes one of the plates to move vertically up or down relative to the other plate depending upon the direction of rotation, thereby enabling the adjacent plates to be positioned in the same or different planes.

Figure 11A:
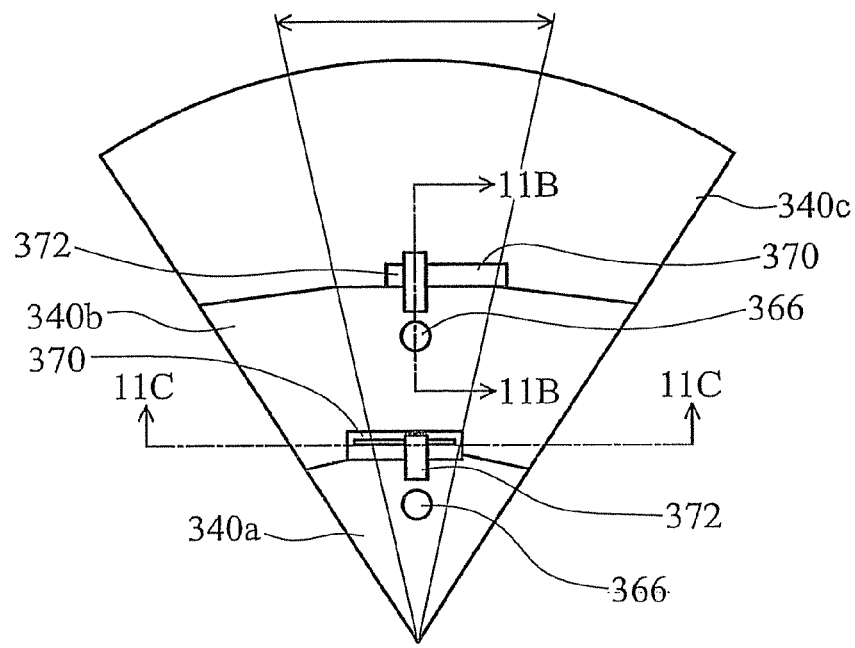
FIG. 11A is a sectional view of the V-shape area shown in FIG. 8A.
Figure 11B:
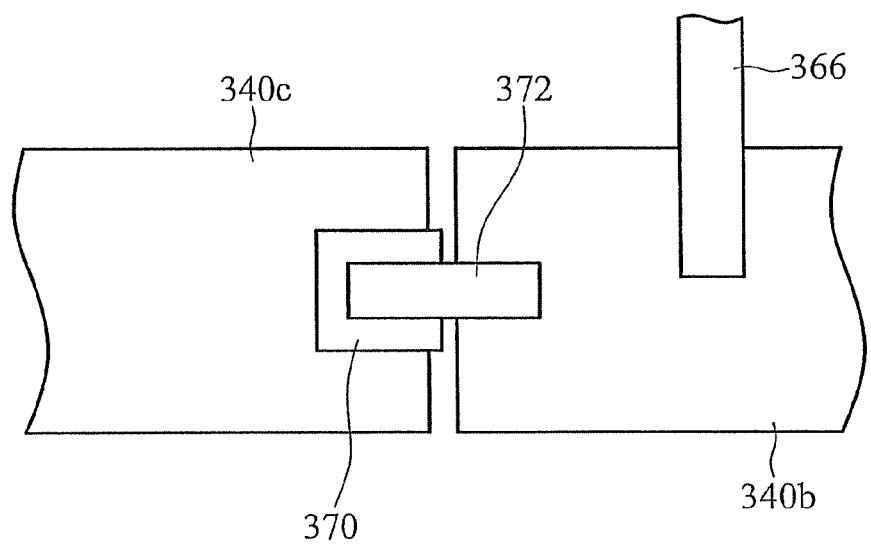
FIG. 11B is a sectional view through line 11B-11B of FIG. 11A.
Figure 11C:
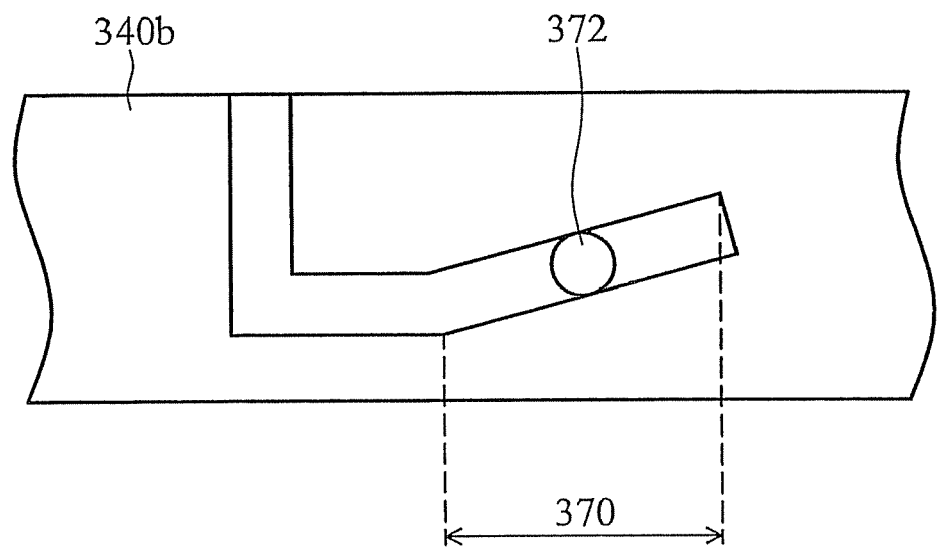
FIG. 11C is a sectional view through line 11C-11C of FIG. 11A.
Figure 11D:
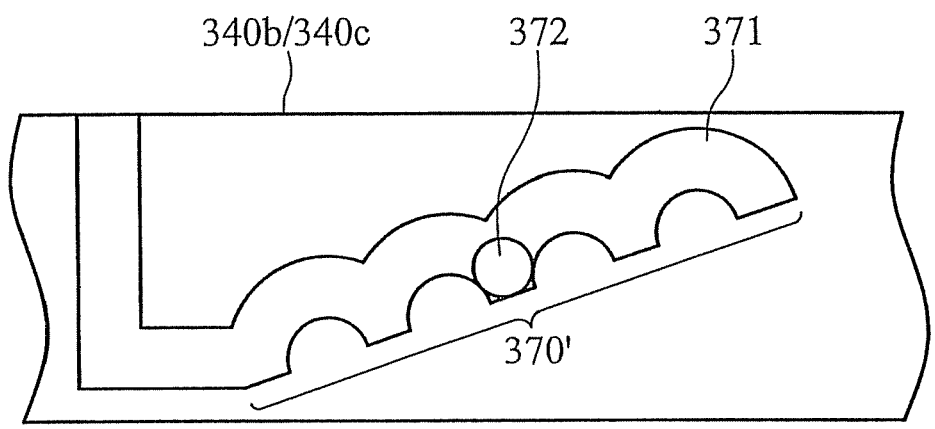
FIG. 11D is a sectional view similar to the view shown in FIG. 11C showing an alternative embodiment of a cam groove.
Figure 12A:
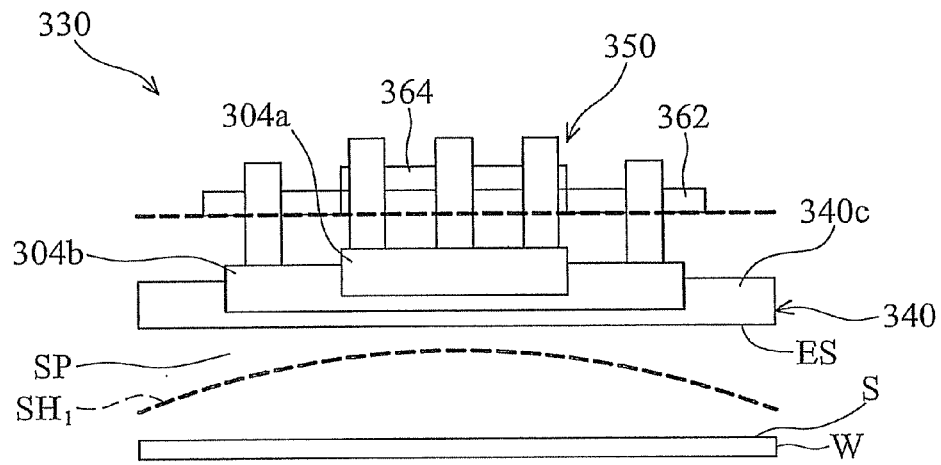
FIGS. 12A-12D are elevational views illustrating the operation of the adjustable upper electrode shown in FIGS. 8A and 8B.
Figure 12B:
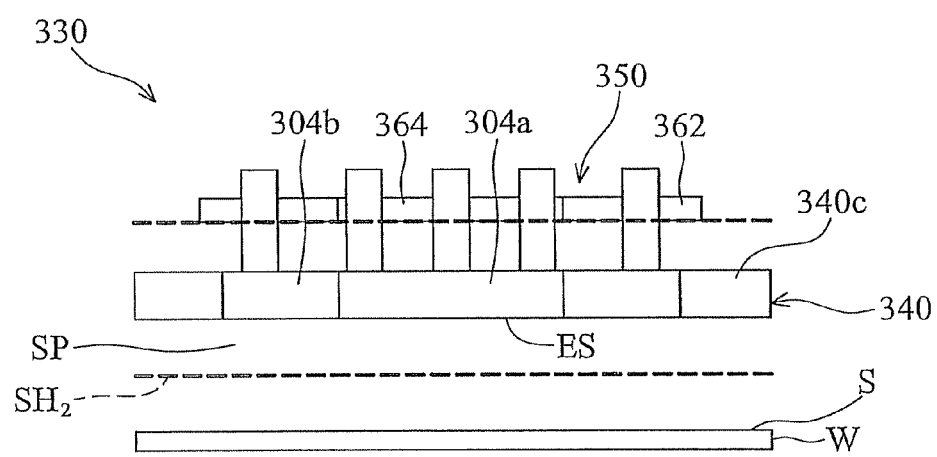
Figure 12C:
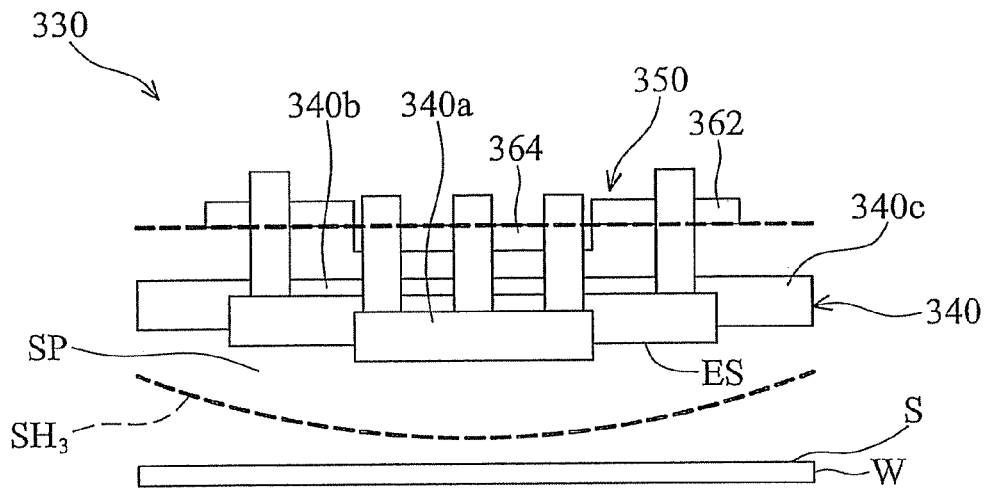
Figure 12D:
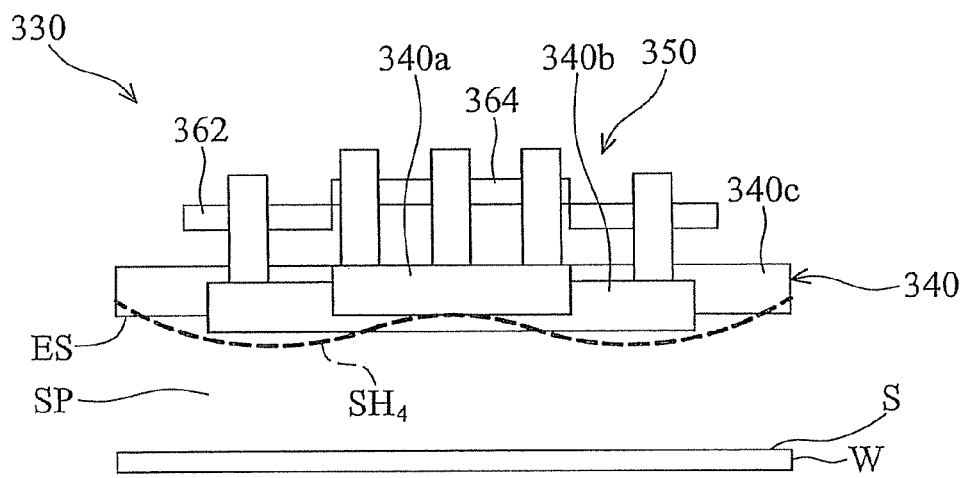

As collectively shown in FIGS. 11A-11D, the cam groove and follower arrangement may comprise two or more equi-spaced inclined, linear cam grooves 370 formed in the inner peripheral surface of each of the outer and intermediate electrode plates 340c and 340b and corresponding equi-spaced cam groove followers 372 projecting from the outer peripheral surface of each of the central and intermediate electrode plates 340a and 340b. In alternative embodiments, the cam followers 372 may be provided on the inner peripheral surfaces of the outer and intermediate electrode plates 340c and 340b and the corresponding inclined cam grooves 370 may be formed in the outer peripheral surfaces of the central and intermediate electrode plates 340a and 340b. In another embodiment, as shown in FIG. 11D, each of the cam grooves denoted by numeral 370' may be configured with a plurality of arcuate shape detents 371 to provide a plurality of discrete electrode shape adjustments 340.

The rotatable slide holder assembly 350 is operated to adjust the shape or tune the electrode 340, by operating the actuator(s) (not shown), which rotate the outer and/or inner rim members 362, 364. As shown in FIGS. 12A-12D, the outer rim member 362 rotates the intermediate electrode plate 340*b* relative to the fixed outer electrode plate 340*c* thereby causing the intermediate electrode plate 340*b* to move vertically up or down relative to the outer electrode plate 340*c*. The inner rim member 364 rotates the central electrode plate 340*a* relative to the intermediate electrode plate 340*b* thereby causing the central electrode plate 340*a* to move vertically up or down relative to the intermediate electrode plate 340*b*. As the central and intermediate electrode plates 340*a* and 340*b* rotate, the cam followers slide (FIG. 11C) or move step-wise (FIG. 11D) up or down their associated cam grooves, depending upon the direction of rotation, thereby causing the central and intermediate electrode plates 340*a* and 340*b* to move vertically up or down, depending upon the direction of rotation, thus varying the shape of the electrode 340. This, in turn, varies the height H of the three-dimensional space SP across the process surface S of the wafer W, to provide a desired ion plasma density distribution within the three-dimensional space SP which suits a given process requirement.

The electrode of the adjustable electrode assembly may be made of any suitable electrode material. In some embodiments, the electrode may be made of a Shape Memory Alloy (SMA) or any other materials with malleability and ductility. The slide holder assemblies of the adjustable electrode assembly may be made of any suitable material including, but not limited to, metal materials, ceramic materials, or the same material the corresponding electrode is made of.

Figure 13:
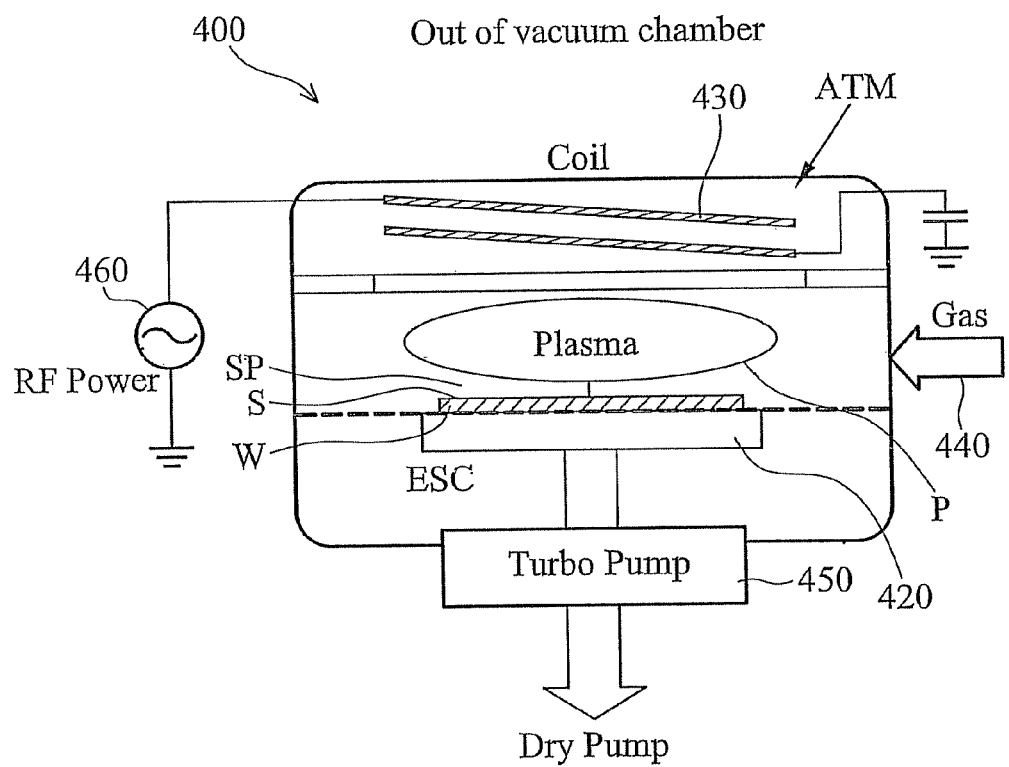
FIG. 13 is a cross-sectional schematic of an embodiment of an ICP reactor for a dry process reactor system, having one or more coils that provide ion plasma density distribution control capability.

FIG. 13 is a cross-sectional schematic of an embodiment of an ICP reactor 400 for a dry process reactor system, having ion plasma density distribution control capability. The ICP reactor 400 may comprise a pressurizable reaction chamber 410 capable of being heated to a temperature ranging, for example, between about 20° C. to about 300° C., and a wafer holder 420 having in any suitable shape, such as circular, elliptical, square, and the like, disposed within the reaction chamber for mounting a wafer 470 (typically about 4 to about 12 inches in diameter or larger) be processed. In some embodiments, the wafer holder 420 may comprise an electrostatic chuck (ESC). In addition, the wafer holder 420/ wafer W may also operate as a fixed lower electrode. An adjustable upper coil 430 is disposed within the reaction chamber 410 above the wafer W/wafer holder 420. Plasma source (reactant) gases may be introduced into the reaction chamber 400 via one or more source gas inlets 440 and spent process gases and etchant by-products may be exhausted from the reaction chamber via a pump 450. In some embodiments, the source gases may be introduced into the reaction chamber 410 at a flow rate of about 0 to about 50,000 sccm (standard cubic centimeters per minute). The wafer W/lower electrode 420 may be connected to ground and the upper coil 430 may be driven by one or more RF generators 460 to generate and control an ion plasma P in a three-dimensional space SP. In some embodiments, the RF power generated by the RF generator 460 may range between about 10 watts to about 50 kilowatts and have a frequency of about 50 KHz to about 100 MHz.

Similar to the adjustable upper electrode described earlier, the adjustable upper coil 430 may be adjusted in accordance with a desired semiconductor process recipe to provide an ion plasma density distribution in the three-dimensional space SP, across the process surface S of the wafer W, which suits a given process requirement.

Figure 14:
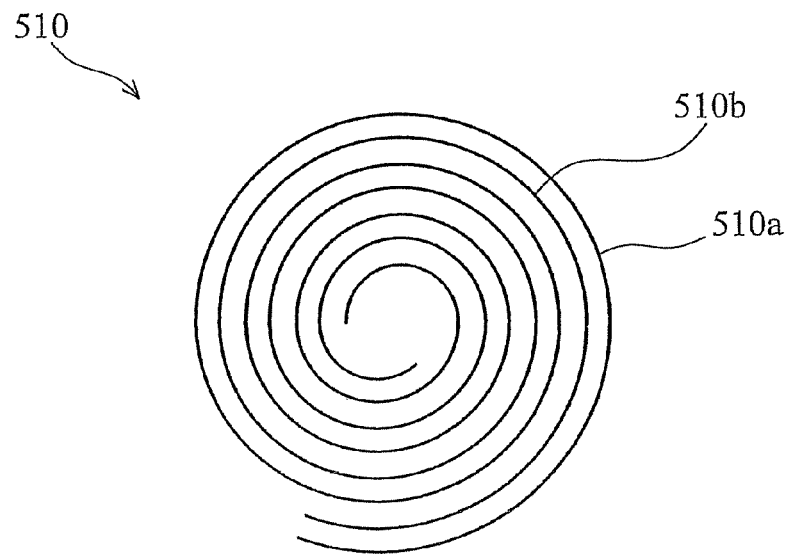
FIGS. 14, 15, 16A-C, and 17A-E illustrate different embodiments of coils that provide ion plasma density distribution control capability.

In one embodiment, as shown in the plan view of FIG. 14, the adjustable upper coil may comprise a coil 510 having at least first and second coils 510*a* and 510*b* wherein windings of the second coil 510*b* are disposed between windings of the first coil 510*a* and wherein each of the coils 510*a*, 510*b* is driven by a separate RF generator or an RF generator with multiple power outputs. The power applied to the coils 510*a*, 510*b* may be independently adjusted to provide a desired ion plasma distribution within the three-dimensional space SP, across the process surface S of the wafer W, in the reaction chamber 410.

Figure 15:
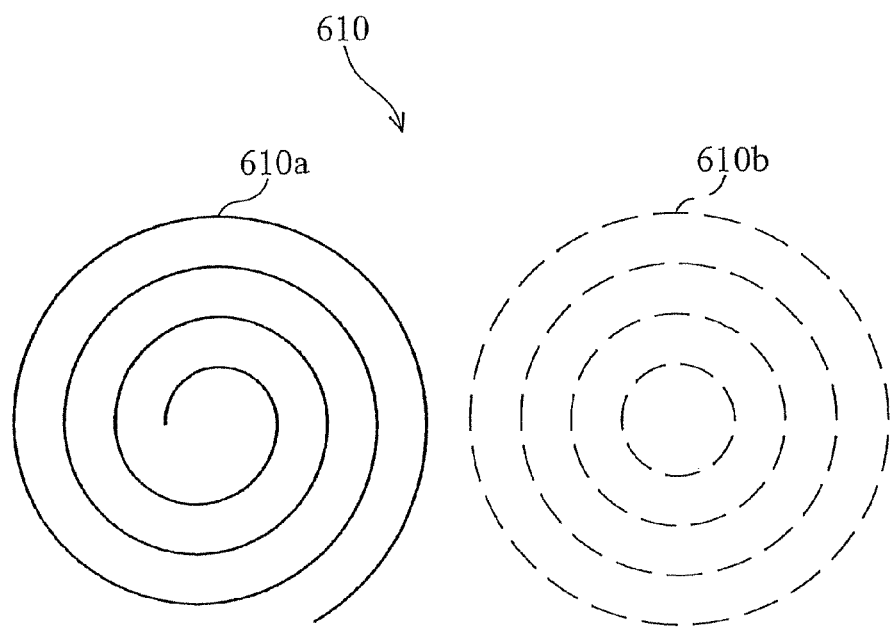

In another embodiment, as shown in the plan view of FIG. 15, the adjustable upper coil may comprise a one or two-dimensional array 610 of coils 610*a*, 610*b*. Each of the coils 610*a*, 610*b* may be driven by a separate RF generator or an RF generator with multiple power outputs so that power applied to the coils 610*a*, 610*b* may be independently adjusted to provide a desired ion plasma distribution within the three-dimensional space SP, across the process surface S of the wafer W, in the reaction chamber 410.

Figure 16A:
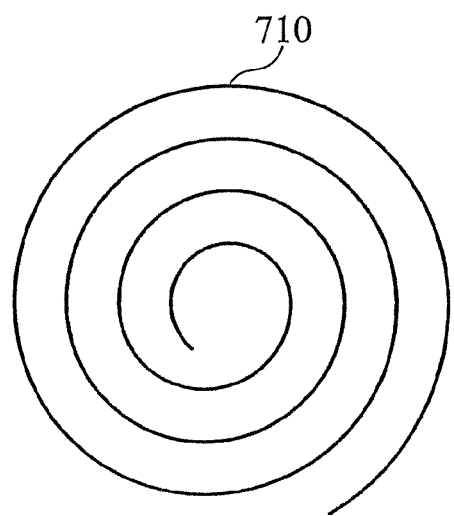
Figure 16B:
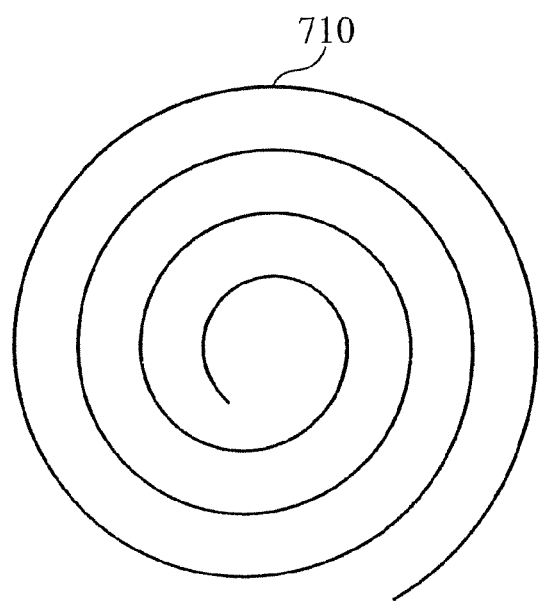
Figure 16C:
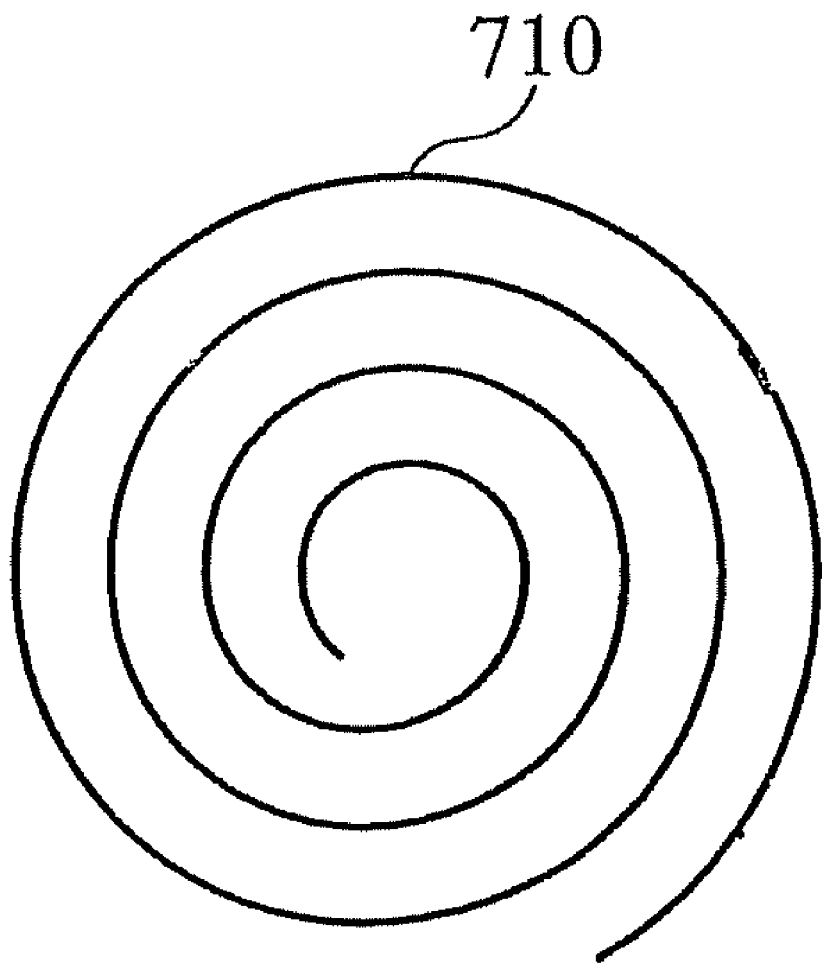
Figure 17A:
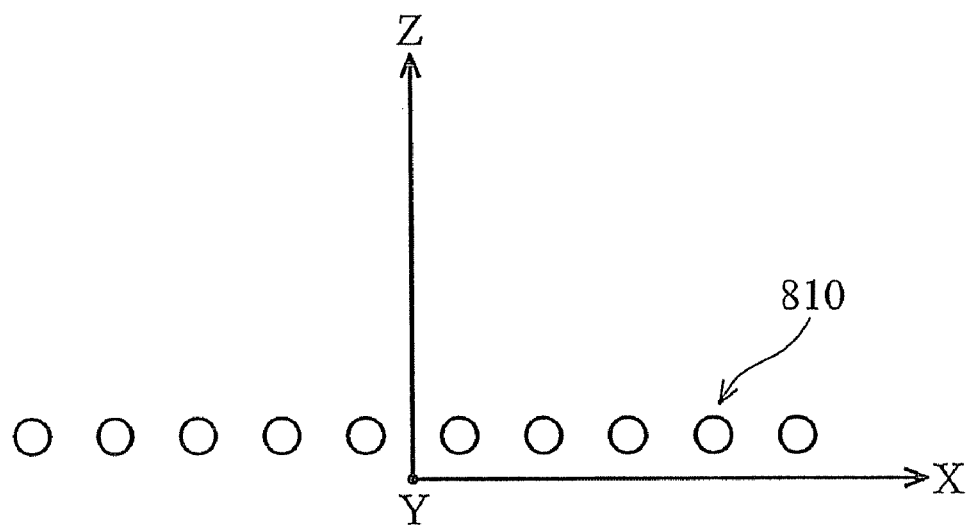
Figure 17B:
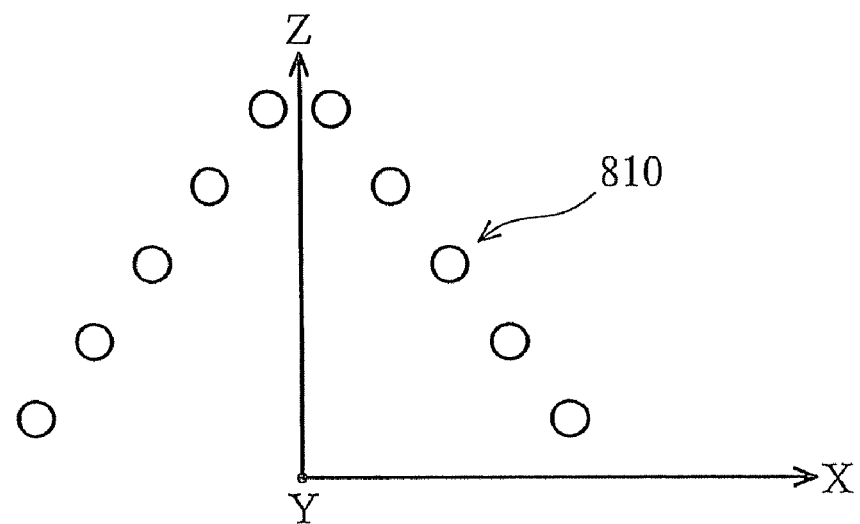
Figure 17C:
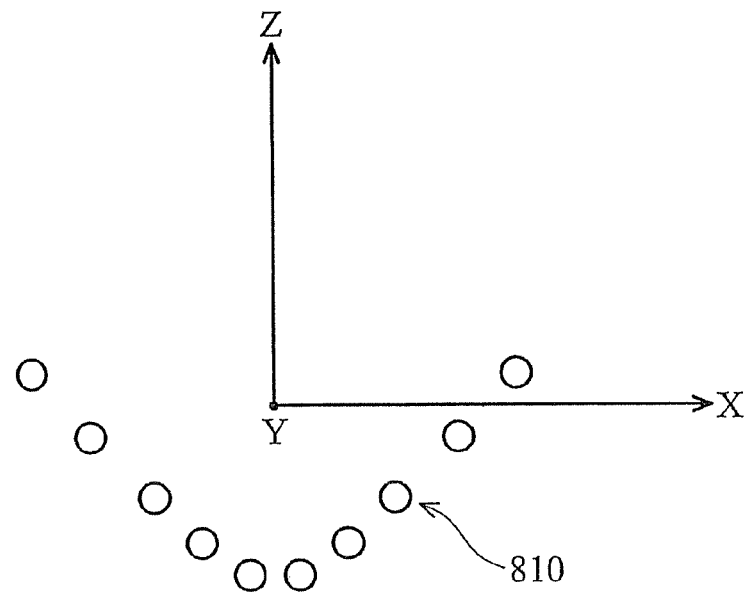
Figure 17D:
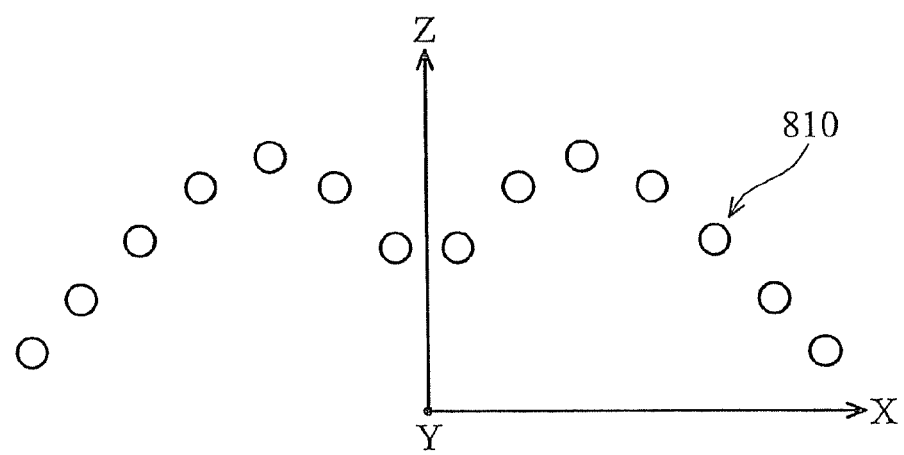
Figure 17E:
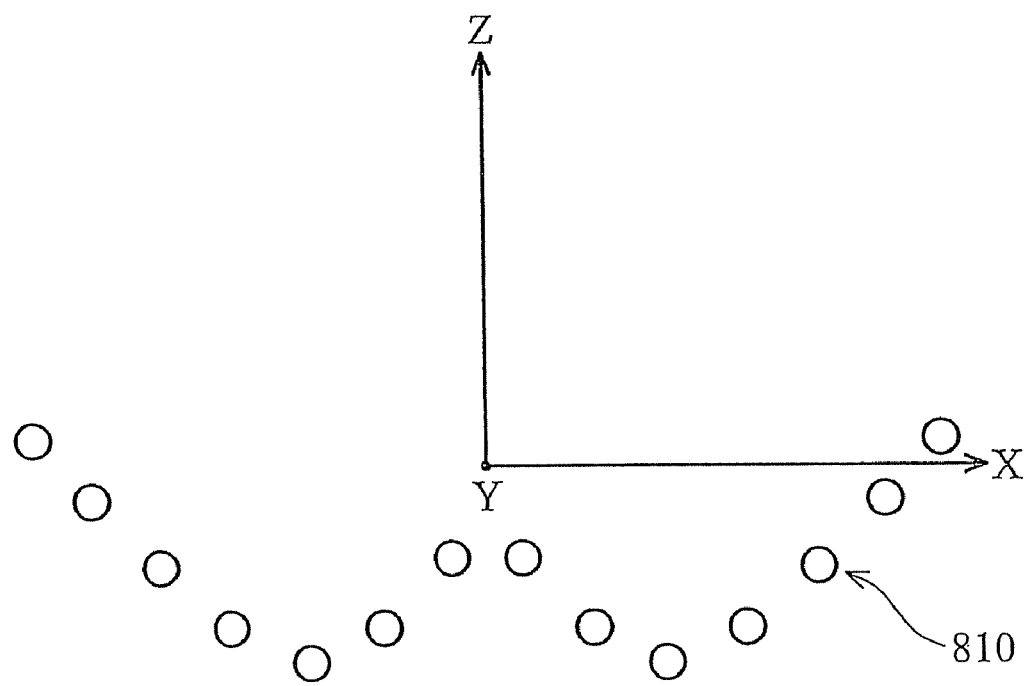

In another embodiment, as shown in the plan views of FIGS. 16A-16C, the adjustable upper coil 430 may comprise an adjustable coil 710 or an array (one or two dimensional array) of adjustable coils (not shown). The coil 710 (or coils) may be adjusted in two dimensions, e.g., x and y directions, by tightening or loosening the coil 710 in manner which reduces or increases the lateral distance between the coil windings to provide a desired ion plasma distribution within the three-dimensional space SP, across the process surface S of the wafer W, in the reaction chamber 410. Alternatively, the coil (or coils) may be adjusted (in the z direction, by changing the length of the coil by stretching or compressing the coil windings. In some embodiments where the one or two dimensional coil array is used, each of the size adjustable coils 710 may also be driven by a separate RF generator or an RF generator with multiple power outputs so that power applied to the coils may be independently adjusted to further modify the ion plasma distribution, as desired, within the three-dimensional space SP, across the process surface S of the wafer W.

In a further embodiment, as shown in the perspective views of FIGS. 17A-17E, the adjustable upper coil may comprise a size adjustable coil 810 (or a one or two dimensional array of size-adjustable coils) wherein the size of the coil 810 (or coils) may be adjusted in three dimensions, e.g., x, y and z directions, by tightening or loosening the windings of the coil 810 and/or changing the length of the coil 810 by stretching or compressing the coil windings. Accordingly, the ion plasma distribution may be selectively varied across the three-dimensional space SP, and therefore across the process surface S of the wafer W, in the reaction chamber 410 to achieve a desired process specification. In some embodiments where the one or two dimensional coil array is used, each of the size adjustable coils may also be driven by a separate RF generator or an RF generator with multiple outputs, so that power applied to the coils may be independently adjusted to further modify the ion plasma distribution, as desired, within the three-dimensional space SP, across the process surface S of the wafer W.

The adjustable coils shown in FIGS. 14 and 15 may also be constructed so that they are adjustable in the z direction in the manner shown, for example, in FIGS. 17A-17E.

The coil of the adjustable coil assembly may be made of any suitable coil material. In some embodiments, the coil may be made of a Shape Memory Alloy (SMA) or any other materials with malleability and ductility.

One of ordinary skill in the art will appreciate that the adjustable electrodes and adjustable coils disclosed herein may be easily adapted to existing reaction chamber designs. Reaction chambers utilizing the adjustable electrodes and coils disclosed herein will help achieve advanced semiconductor process requirements including without limitation uniformity of etch rate, etch profile, CDU, etch selectivity, residue, deposition rate and so on.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. An apparatus comprising:
   a reaction chamber defining a reaction space;
   a holder disposed within the reaction chamber, the holder for holding a semiconductor wafer or substrate;
   an adjustable electrode formed by at least two electrode plates which are movable relative to one another for changing a shape of the adjustable electrode, the adjustable electrode disposed in the chamber and spaced from the holder, the adjustable electrode for generating a plasma having a density that can be selectively varied across the reaction space of the reaction chamber; and
   a movable slide holder assembly for moving one of the at least two electrode plates relative to the other one of the at least two electrode plates, the slide holder assembly including a movable hub member, two or more arm members extending from the hub member, and a plurality of rod-shape connecting elements connecting the arm members to the at least two electrode plates.

2. The apparatus of claim 1, wherein the space is formed between a wafer or substrate held by the holder and the adjustable electrode, the reaction space having at least one dimension, which can be selectively varied by adjusting a dimension or a shape of the adjustable electrode.

3. The apparatus of claim 1, wherein the electrode plates are driven independently of one another by separate electric potentials.

4. The apparatus of claim 1, wherein the reaction chamber comprises a chemical vapor deposition plasma reaction chamber for depositing semiconductor wafer films.

5. The apparatus of claim 1, wherein the reaction chamber comprises a plasma etching reaction chamber for etching semiconductor wafers.

6. The apparatus of claim 1, wherein the holder is configured to hold a semiconductor wafer or substrate having a diameter of about 4 inches and a diameter of greater than 4 inches.

7. An apparatus comprising:
   a reaction chamber defining a reaction space;
   a holder disposed within the reaction chamber, the holder for holding a semiconductor wafer or substrate;
   an adjustable electrode formed by at least two electrode plates which are movable relative to one another for changing a shape of the adjustable electrode, the adjustable electrode disposed in the chamber and spaced from the holder, the adjustable electrode for generating a plasma having a density that can be selectively varied across the reaction space of the reaction chamber; and
   a slide holder assembly for moving one of the at least two electrode plates relative to the other one of the at least two electrode plates, the slide holder assembly including a rim member for selectively rotating one of the at least two electrode plates and a cam groove and follower arrangement for causing the electrode plates to move up or down when rotated relative to one another by the rim member.

8. The apparatus of claim 7, wherein the space is formed between a wafer or substrate held by the holder and the adjustable electrode, the reaction space having at least one dimension, which can be selectively varied by adjusting a dimension or a shape of the adjustable electrode.

9. The apparatus of claim 7, wherein the electrode plates are driven independently of one another by separate electric potentials.

10. The apparatus of claim 7, wherein the reaction chamber comprises a chemical vapor deposition plasma reaction chamber for depositing semiconductor wafer films.

11. The apparatus of claim 7, wherein the reaction chamber comprises a plasma etching reaction chamber for etching semiconductor wafers.

12. The apparatus of claim 7, wherein the holder is configured to hold a semiconductor wafer or substrate having a diameter of about 4 inches and a diameter of greater than 4 inches.

13. A method comprising the steps of:
    placing a wafer or substrate into a reaction chamber defining a reaction space and comprising an adjustable electrode formed by at least two electrode plates which are movable relative to one another for changing a shape of the electrode and a movable slide holder assembly for moving one of the at least two electrode plates relative to the other one of the at least two electrode plates, the slide holder assembly including a movable hub member, two or more arm members extending from the hub member and a plurality of rod-shale connecting elements connecting the arm members to the at least two electrode plates; and
    adjusting the adjustable electrode to generate a plasma having a density that can be selectively varied across the reaction space within the reaction chamber.

14. The method of claim 13, wherein the reaction space is across the wafer or substrate and wherein adjusting step is performed by adjusting the shape of the adjustable electrode so that the reaction space across the wafer or substrate is capable of being selectively varied in height.

15. The method of claim 13, further comprising the step of applying an electric potential between the adjustable electrode and the wafer or substrate.

16. The method of claim 14, wherein the adjustable electrode is adjusted into a planar shape so that the height of the reaction space is substantially constant across the wafer or substrate.

17. The method of claim 14, wherein the adjustable electrode is adjusted into a convex or concave shape so that the height of the reaction space is varied across the wafer or substrate.

18. The method of claim 14, wherein the adjustable electrode is adjusted into an undulating shape so that the height of the reaction space is varied across the wafer or substrate.

19. The method of claim 13, wherein the electrode plates are driven independently of one another by separate electric potentials.

20. The method of claim 14, wherein the electrode plates are driven independently of one another by separate electric potentials.

21. An adjustable electrical conductor comprising:
    an adjustable coil, the adjustable coil including at least two windings which are movable relative to one another for changing at least one dimension of the adjustable coil; and
    at least a second adjustable coil including at least two windings which are movable relative to one another for changing at least one dimension of the second adjustable coil,
    wherein the adjustable coil in use in a reaction chamber is capable of generating a plasma having a density that can be selectively varied across a space within the reaction chamber and wherein the space within the reaction chamber is formed between a wafer or substrate disposed in the reaction chamber and the adjustable coils the space having at least one dimension which can be selectively varied by adjusting the at least one dimension of one or both of the adjustable coils.

22. The adjustable electrical conductor of claim 21, wherein the adjustable coils are driven independently of one another by separate electric potentials.

23. An apparatus comprising:
a reaction chamber;
a holder disposed within the reaction chamber, the holder for holding a semiconductor wafer or substrate;
an adjustable a coil having at least two windings which are movable relative to one another for changing at least one dimension of the coil, the adjustable coil disposed in the chamber and spaced from the holder, the adjustable coil for generating a plasma having a density that can be selectively varied across a space within the reaction chamber; and
at least a second coil including at least two windings that are movable relative to one another for changing at least one dimension of the second coil.

24. The apparatus of claim 23, wherein the coils are driven independently of one another by separate electric potentials.

25. A method comprising the steps of:
placing a wafer or substrate into a reaction chamber comprising an adjustable coil including at least two windings which are movable relative to one another for changing at least one dimension of the adjustable coil and at least a second adjustable coil including at least two windings which are movable relative to one another for chan at least one dimension of the in second adjustable coil; and
adjusting the at least one dimension of at least one of the adjustable coil and the at least second adjustable coil to generate a plasma having a density that can be selectively varied across a space within the reaction chamber.

26. The method of claim 25, further comprising at least a second coil and further comprising the step of driving the coils independently of one another by separate electric potentials.

27. An adjustable electrical conductor comprising:
an adjustable electrode; and
a linearly movable slide holder assembly for adjusting the adjustable electrode, the linearly movable holder assembly including an arm member and a plurality of rod-shape connecting elements connecting the arm member to the adjustable electrode,
wherein the adjustable electrode in use in a reaction chamber is capable of generating a plasma having a density that can be selectively varied across a space within the reaction chamber.

28. The adjustable electrical conductor of claim 27, wherein the adjustable electrode is formed by at least two plates which are movable relative to one another for changing a shape of the adjustable electrode.

29. The adjustable electrical conductor of claim 28, wherein the plates are driven independently of one another by separate electric potentials.

30. The adjustable electrical conductor of claim 28, wherein the linearly movable slide holder assembly moves one of the at least two plates relative to the other one of the at least two plates.

31. A method comprising the steps of:
placing a wafer or substrate into a reaction chamber defining a reaction space and comprising an adjustable electrode formed by at least two electrode plates which are movable relative to one another for changing a shape of the electrode and a movable slide holder assembly for moving one of the at least two electrode plates relative to the other one of the at least two electrode plates, the slide holder assembly including a rim member for selectively rotating at least of the at least two electrode plates and a cam groove and follower arrangement for causing the electrode plates to move up or down when rotated relative to one another by the rim member; and
adjusting the adjustable electrode to generate a plasma having a density that can be selectively varied across the reaction space within the reaction chamber.

32. The method of claim 31, wherein the reaction space is across the wafer or substrate and wherein adjusting step is performed by adjusting the shape of the adjustable electrode so that the reaction space across the wafer or substrate is capable of being selectively varied in height.

33. The method of claim 31, further comprising the step of applying an electric potential between the adjustable electrode and the wafer or substrate.

34. The method of claim 32, wherein the adjustable electrode is adjusted into a planar shape so that the height of the reaction space is substantially constant across the wafer or substrate.

35. The method of claim 32, wherein the adjustable electrode is adjusted into a convex or concave shape so that the height of the reaction space is varied across the wafer or substrate.

36. The method of claim 32, wherein the adjustable electrode is adjusted into an undulating shape so that the height of the reaction space is varied across the wafer or substrate.

37. The method of claim 31, wherein the electrode plates are driven independently of one another by separate electric potentials.

38. The method of claim 32, wherein the electrode plates are driven independently of one another by separate electric potentials.

* * * * *

UNITED STATES PATENT AND TRADEMARK OFFICE
CERTIFICATE OF CORRECTION

| | | |
|---|---|---|
| PATENT NO. | : 7,829,815 B2 | Page 1 of 1 |
| APPLICATION NO. | : 11/534495 | |
| DATED | : November 9, 2010 | |
| INVENTOR(S) | : Chen et al. | |

It is certified that error appears in the above-identified patent and that said Letters Patent is hereby corrected as shown below:

Column 10, Claim 13, Line 26, delete "rod-shale" and insert -- "rod-shape" -- therefor.

Signed and Sealed this
Nineteenth Day of April, 2011

David J. Kappos
*Director of the United States Patent and Trademark Office*